(12) United States Patent
Bajaj et al.

(10) Patent No.: US 9,991,129 B1
(45) Date of Patent: Jun. 5, 2018

(54) SELECTIVE ETCHING OF AMORPHOUS SILICON OVER EPITAXIAL SILICON

(71) Applicant: Applied Materials, Inc., Santa Clara, CA (US)

(72) Inventors: Geetika Bajaj, New Delhi (IN); Prerna Sonthalia Goradia, Mumbai (IN); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days. days.

(21) Appl. No.: 15/603,076

(22) Filed: May 23, 2017

(51) Int. Cl.
| | |
|---|---|
| *H01L 21/302* | (2006.01) |
| *H01L 21/3065* | (2006.01) |
| *H01L 29/165* | (2006.01) |
| *H01L 21/02* | (2006.01) |
| *H01L 21/3213* | (2006.01) |
| *H01L 23/29* | (2006.01) |
| *H01L 21/67* | (2006.01) |

(52) U.S. Cl.
CPC .... *H01L 21/3065* (2013.01); *H01L 21/02068* (2013.01); *H01L 21/32132* (2013.01); *H01L 21/32137* (2013.01); *H01L 23/298* (2013.01); *H01L 29/165* (2013.01); *H01L 21/67069* (2013.01); *H01L 21/67167* (2013.01)

(58) Field of Classification Search
CPC ......... H01L 21/02068; H01L 21/32132; H01L 21/32137; H01L 21/76256; H01L 23/298
USPC ................................ 438/707, 719, 723, 743
See application file for complete search history.

(56) References Cited

U.S. PATENT DOCUMENTS

| | | | | |
|---|---|---|---|---|
| 5,326,406 | A | * | 7/1994 | Kaneko ................. B08B 7/0057 134/1 |
| 5,762,755 | A | * | 6/1998 | McNeilly .......... H01L 21/02019 134/1.2 |
| 7,005,245 | B1 | * | 2/2006 | Kubacki ................ G02B 6/132 385/141 |
| 2013/0023125 | A1 | * | 1/2013 | Singh .................. H01L 21/3065 438/706 |
| 2014/0262755 | A1 | | 9/2014 | Deshmukh et al. | |
| 2017/0011887 | A1 | | 1/2017 | Deshmukh et al. | |
| 2017/0170036 | A1 | * | 6/2017 | Fischer ................. H05G 2/003 |

* cited by examiner

*Primary Examiner* — Binh X Tran
(74) *Attorney, Agent, or Firm* — Kilpatrick Townsend & Stockton LLP

(57) ABSTRACT

Systems and methods of etching a semiconductor substrate may include concurrent exposure of the semiconductor substrate to a chlorine-containing precursor and ultraviolet (UV) light. The semiconductor substrate may include exposed amorphous silicon. The semiconductor substrate may further include exposed crystalline silicon or underlying crystalline silicon. The methods may further include removing amorphous silicon faster than crystalline silicon.

15 Claims, 4 Drawing Sheets

SELECTIVE ETCHING OF AMORPHOUS SILICON OVER EPITAXIAL SILICON

TECHNICAL FIELD

The present technology relates to semiconductor systems, processes, and equipment. More specifically, the present technology relates to systems and methods for selectively etching amorphous silicon faster than crystalline silicon.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be referred to as wet or dry based on the phase of the etchants used in the process. A wet HF etch preferentially removes silicon oxide over other dielectrics and materials. However, wet processes may have difficulty penetrating some constrained trenches and also may sometimes deform patterned features. Dry etches are preferred when suitable chemistries are available and known. Dry etch chemistries can penetrate more constrained trenches and exhibit less deformation of delicate structures. However, dry etches are sometimes unavailable or at least unknown for a specific pair of materials.

Thus, there is a need for improved systems and methods that can be used to selectively remove an ever-increasing suite of materials with respect to other materials which may be present on patterned substrate in novel process flows.

SUMMARY

Methods of etching a semiconductor substrate are described. In embodiments, the methods include flowing a chlorine-containing precursor into a substrate processing region housing the semiconductor substrate. The semiconductor substrate includes an exposed amorphous silicon portion and an exposed crystalline silicon portion. The methods further include shining ultraviolet light onto the semiconductor substrate. Shining ultraviolet light onto the semiconductor substrate occurs concurrently with the flowing of the chlorine-containing precursor into the substrate processing region. The methods further include removing an amount of the exposed amorphous silicon portion at a first etch rate.

The methods may further include removing an amount of the exposed crystalline silicon portion at a second etch rate. The first etch rate may be greater than the second etch rate. The first etch rate may be greater than the second etch rate by a factor of ten or more. The exposed crystalline silicon portion may include one of single-crystal silicon or polysilicon. The chlorine-containing precursor may include $Cl_2$. Removing the amount of the exposed amorphous silicon portion may or may not remove any of the exposed crystalline silicon portion in embodiments. The substrate processing region may be plasma-free while removing the amount of the exposed amorphous silicon portion. Shining the ultraviolet light may include shining UVA light having wavelengths between 315 nm and 400 nm. A partial-pressure of the chlorine-containing precursor in the substrate processing region may be between 50 mTorr and 50 Torr while removing the amount of the exposed amorphous silicon portion.

Additional methods of etching a semiconductor substrate are described. The methods include flowing a chlorine-containing precursor into a substrate processing region housing the semiconductor substrate. The semiconductor substrate includes an exposed amorphous silicon portion and an underlying crystalline silicon portion. The methods further include shining ultraviolet light onto the semiconductor substrate. Shining ultraviolet light onto the semiconductor substrate occurs concurrently with the flowing of the chlorine-containing precursor into the substrate processing region. The methods further include removing the exposed amorphous silicon portion and exposing the underlying crystalline silicon portion. Shining the ultraviolet light may include shining UVA light from outside the substrate processing region into the substrate processing region. The substrate temperature may be greater than 25° C. and less than 600° C. or between 65° C. and 105° C. while removing the exposed amorphous silicon portion.

Additional methods of etching a patterned semiconductor substrate are also presented. The methods include removing a native oxide from a patterned semiconductor substrate. The methods further include forming an exposed crystalline silicon portion of the patterned semiconductor substrate by removing the native oxide. The methods further include forming an exposed amorphous silicon portion of the patterned semiconductor substrate by removing the native oxide. The methods further include exposing both the exposed crystalline silicon portion and the exposed amorphous silicon portion to a chlorine-containing precursor. The methods further include exposing a dielectric gapfill portion disposed underneath the exposed amorphous silicon portion by removing the exposed amorphous silicon portion at a first etch rate while shining ultraviolet light onto the patterned semiconductor substrate. Exposing the dielectric gapfill portion leaves a silicon germanium portion disposed underneath the exposed crystalline silicon portion still covered and unexposed. The methods may further include removing an amount of the exposed crystalline silicon portion at a second etch rate. The first etch rate may be greater than the second etch rate by a factor of ten or more. The exposed crystalline silicon portion may be epitaxial silicon formed on the silicon germanium portion prior to removing the native oxide.

Such technology may provide numerous benefits over conventional systems and techniques. For example, selectively removing amorphous silicon may allow other exposed structures to be maintained, which may improve device integrity and performance. Additionally, the materials utilized may allow the selective removal of materials that previously could not be selectively removed. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
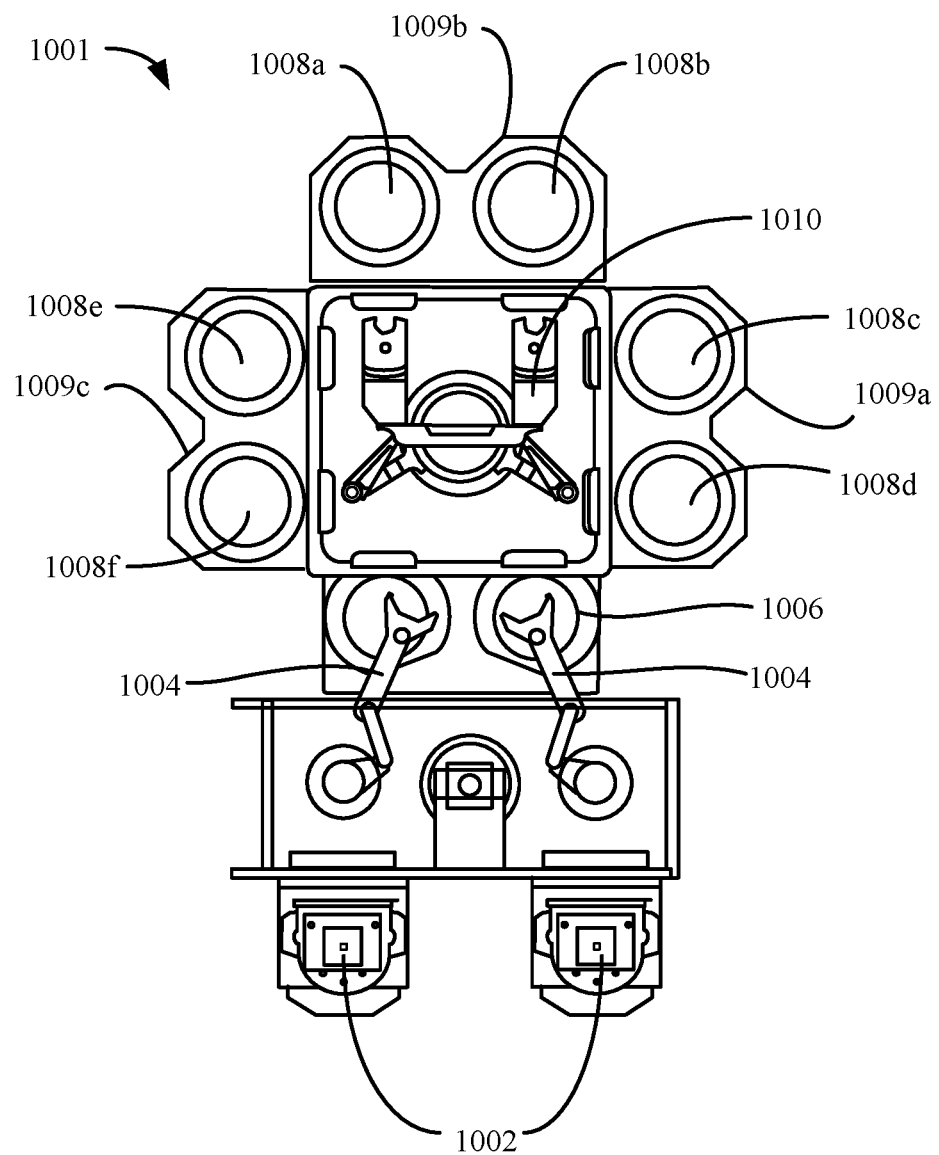
FIG. 1 shows a top plan view of an exemplary processing system according to the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology relates to selective removal of material from semiconductor substrates. Systems and methods of etching a semiconductor substrate may include flowing a chlorine-containing precursor into a substrate processing region of a semiconductor processing chamber. The substrate processing region may house the semiconductor substrate and the methods may include shining UV-light on the semiconductor substrate while exposing the semiconductor substrate to the chlorine-containing precursor. The semiconductor substrate may include exposed amorphous silicon. The semiconductor substrate may further include exposed crystalline silicon or underlying crystalline silicon. The methods may further include removing amorphous silicon faster than crystalline silicon.

During processing, such as front-end-of-line processing, it may be desirable to selectively form crystalline silicon (e.g. epitaxial silicon) on exposed silicon germanium but not on other exposed portions. However, depositing epitaxial silicon on silicon germanium has been found to also deposit silicon on exposed dielectric portions in the form of amorphous silicon (e.g. at deposition temperatures of 600° C. or below). A benefit of the methods and systems described herein include preferential removal of the amorphous silicon while retaining the desirable epitaxial silicon. Generally speaking, crystalline silicon (single crystal or polycrystalline silicon) may be retained while amorphous silicon is removed. Crystalline silicon may be exposed throughout the etch process in embodiments. In other embodiments, the amorphous silicon may reside above crystalline silicon and the etch process removes amorphous silicon and stops once the crystalline silicon is exposed. In other words, the crystalline silicon may function as an etch-stop layer.

The etch processes presented herein may be gas-phase etch processes. As feature sizes continue to reduce and aspect ratios continue to increase, wet etchants that may selectively remove one material over another may no longer be viable. The surface tension of the etchants applied to the substrates may deform or collapse the delicate features, which may cause device failure. Implementing the etch processes described herein may avoid collapsing small features on a patterned semiconductor substrate, increasing manufacturing yields and profitability. After identifying one exemplary system in which the present structures may be formed, the disclosure will discuss specific structures, as well as methods of performing selective removal of particular materials.

FIG. 1 shows a top plan view of one embodiment of a processing system 1001 of deposition, etching, baking, and curing chambers according to disclosed embodiments. In the figure, a pair of front opening unified pods (FOUPs) 1002 supply substrates of a variety of sizes that are received by robotic arms 1004 and placed into a low pressure holding area 1006 before being placed into one of the substrate processing chambers 1008*a-f*, positioned in tandem sections 1009*a-c*. A second robotic arm 1010 may be used to transport the substrate wafers from the holding area 1006 to the substrate processing chambers 1008*a-f* and back. Each substrate processing chamber 1008*a-f*, can be outfitted to perform a number of substrate processing operations including the etch processes described herein in addition to cyclical layer deposition (CLD), atomic layer deposition (ALD), chemical vapor deposition (CVD), physical vapor deposition (PVD), epitaxial silicon growth, etch, pre-clean, degas, orientation, and other substrate processes.

The substrate processing chambers 1008*a-f* may include one or more system components for depositing, annealing, curing and/or etching material films on the substrate wafer. In one configuration, two pairs of the processing chamber, e.g., 1008*c-d* and 1008*e-f*, may be used to deposit dielectric material on the substrate, and the third pair of processing chambers, e.g., 1008*a-b*, may be used to etch the deposited dielectric. In another configuration, all three pairs of chambers, e.g., 1008*a-f*, may be configured to etch a material on the substrate. Any one or more of the processes described below may be carried out in chamber(s) separated from the fabrication system shown in different embodiments. It will be appreciated that additional configurations of deposition, etching, annealing, and curing chambers for dielectric films are contemplated by system 1001. Many chambers may be utilized in the processing system 1001, and may be included as tandem chambers, which may include two similar chambers sharing precursor, environmental, or control features.

Figure 2:
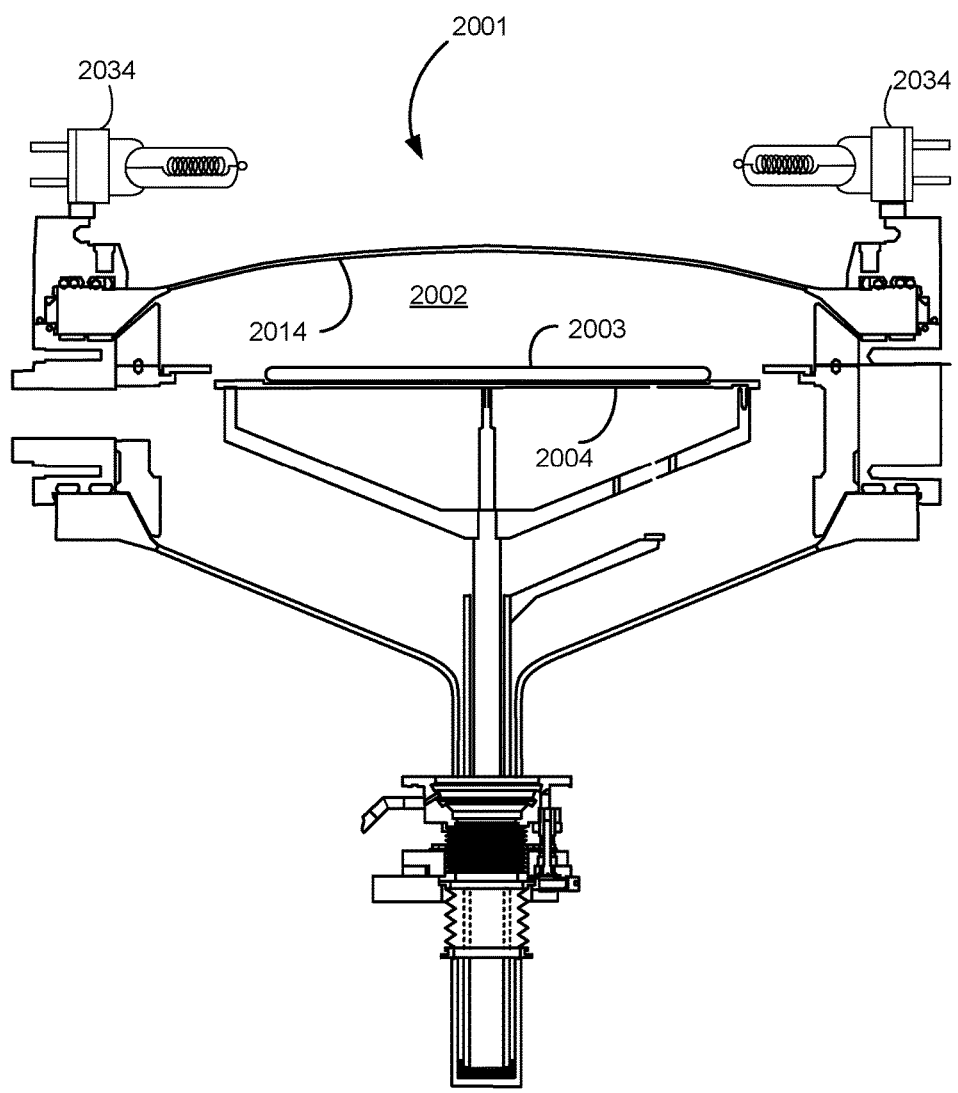
FIG. 2 shows a schematic cross-sectional view of an exemplary processing chamber according to the present technology.

FIG. 2 shows a cross-section of a substrate processing chamber 2001 with a substrate processing region 2002 housing a semiconductor substrate 2003 on a substrate susceptor 2004. In embodiments, a quartz dome 2014 is configured to transmit ultraviolet (UV) light from the UV lamp(s) 2034 into the substrate processing region 2002. The UV light from the UV lamp(s) 2034 impinges upon semiconductor substrate 2003 during the etching processes described herein.

Substrate processing chamber 2001 may be used to deposit or etch materials or perform operations discussed in relation to the present technology. Substrate processing chamber 2001 may be utilized without plasma formation in the operations performed. Substrate processing chamber 2001 is included only as an exemplary chamber that may be utilized in conjunction with the present technology. It is to be understood that operations of the present technology may be performed in substrate processing chamber 2001 or any number of other chambers.

Figure 3:
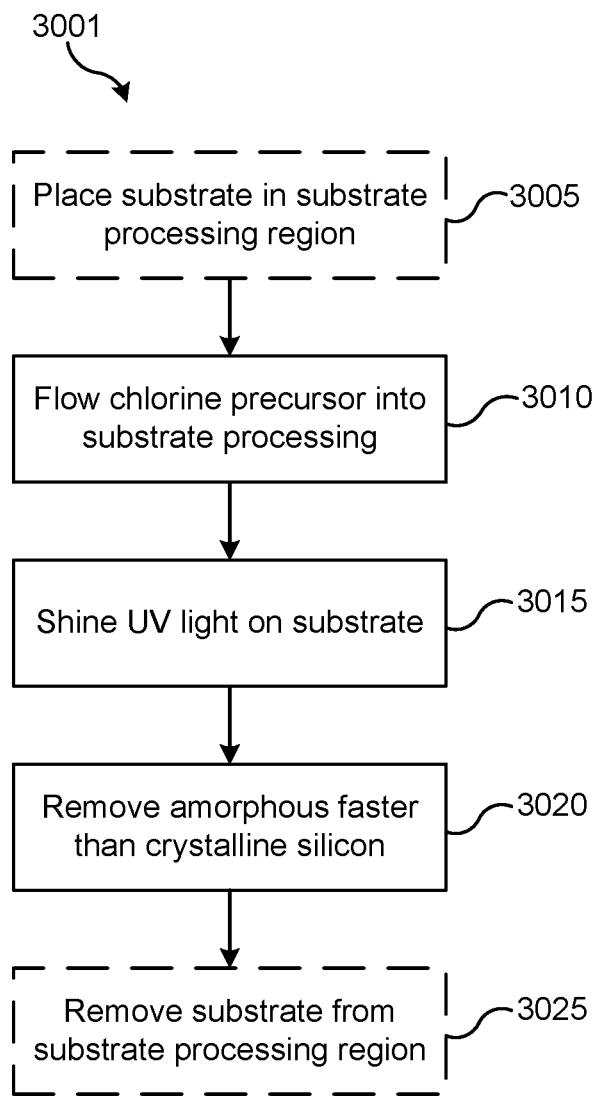
FIG. 3 shows selected operations in a method of selectively etching a semiconductor substrate according to the present technology.

FIG. 3 shows selected operations in a method 3001 of selectively etching an amorphous silicon portion, one or more of which may be performed, for example, in the substrate processing chamber 2001 as previously described, or in different chambers. The method 3001 may include one or more operations prior to the initiation of the method, including front-end processing, deposition, etching, polishing, cleaning, or any other operations that may be performed prior to the described operations. A processed substrate, which may be a semiconductor wafer of any size, may be positioned within a chamber for the method 3001. In embodiments, the operations of method 3001 may be performed in multiple chambers depending on the operations being performed. Additionally, the entire method 3001 may be performed in a single chamber to reduce queue times, contamination issues, and vacuum break. Subsequent operations to those discussed with respect to method 3001 may also be performed in the same chamber or in different chambers as would be readily appreciated by the skilled artisan.

The method 3001 may optionally include placing a patterned substrate into a substrate processing region of a semiconductor processing chamber at operation 3005. The semiconductor substrate may include one or more exposed portions of silicon, and may include at least one other exposed material in embodiments, although multiple materials may be exposed on a substrate including the exposed silicon portion. The method 3001 includes flowing a chlorine-containing precursor into a substrate processing region of a semiconductor processing chamber at operation 3010. The method 3001 includes shining ultraviolet (UV) light into the substrate processing region onto the semiconductor substrate at operation 3015. Flowing the chlorine-containing precursor into the substrate processing region at the same time UV-light is shone onto the semiconductor substrate has been found to preferentially remove amorphous silicon compared to crystalline silicon. Operation 3010 and operation 3015 may overlap or coincide according to embodiments. Operation 3010, operation 3015, and operation 3020 may overlap or coincide in embodiments. Following any or all of operations 3010, 3015 and 3020, unreacted chlorine-containing precursor or other process effluents may be removed from the substrate processing region through a vacuum pump.

The chlorine-containing precursor may be a chemical which includes chlorine. The chlorine-containing precursor may include one or more of chlorine ($Cl_2$), hydrogen chloride (HCl), chloroform ($CHCl_3$), methyl chloride ($CH_3Cl$), carbon tetrachloride ($CCl_4$), lithium chloride (LiCl), magnesium chloride ($MgCl_2$), and chlorine dioxide ($ClO_2$) in embodiments. The UV frequency(ies) used to promote the reaction may be selected to increase/optimize/maximize absorption of UV light by the chlorine-containing precursor. The chlorine-containing precursor may be flowed directly into the substrate processing region without first passing through a plasma prior to delivery to the substrate according to embodiments. The chlorine-containing precursor may not pass through any plasma before entering the substrate processing region in embodiments.

Process conditions may affect one or more aspects of the methods of the present technology. Temperature may be adjusted to cause, increase the efficiency of, or otherwise contribute to the operations of the method. One or more operations of method 3001 may be performed at a temperature greater than 25° C. Operations may be performed while the substrate is between 25° C. and 600° C. or preferably between 45° C. and 135° C. or between 65° C. and 105° C. for highest amorphous silicon selectivity. In embodiments, the substrate temperature may be greater than 25° C., greater than 30° C., greater than 35° C., greater than 40° C., greater than 45° C., greater than 50° C., greater than 55° C., greater than 60° C., greater than 65° C., greater than 70° C., greater than 75° C., greater than 80° C., greater than 90° C., greater than 100° C., greater than 110° C., greater than 120° C., greater than 130° C., greater than 140° C., greater than 150° C., greater than 160° C., greater than 170° C., greater than 180° C., greater than 190° C., greater than 200° C., greater than 210° C., greater than 220° C., greater than 230° C., or higher. Substrate temperatures above about 150° C. result in adequate removal rate of amorphous silicon but increase the removal rate of crystalline silicon as well. The substrate temperature may be less than 600° C., less than 550° C., less than 530° C., less than 510° C., less than 490° C., less than 470° C., less than 450° C., less than 430° C., less than 410° C., less than 390° C., less than 370° C., less than 350° C., less than 330° C., less than 310° C., less than 290° C., less than 270° C., less than 250° C., less than 230° C., less than 210° C., less than 190° C., less than 180° C., less than 170° C., less than 160° C., less than 150° C., less than 140° C., less than 130° C., less than 120° C., or less than 110° C. according to embodiments. In embodiments, the substrate temperature may be any temperature included within one of these ranges, or a smaller range encompassed by any of these ranges or noted temperatures.

Additional chamber conditions including pressure may be adjusted to affect the operations being performed, such as the etch rate of the amorphous silicon portion. The pressure within the substrate processing region may be between 50 mTorr and 50 Torr, in embodiments, during the etching of amorphous silicon. The pressure in the substrate processing region may be below 50 Torr, below 40 Torr, below 20 Torr, below 10 Torr, below 5 Torr, below 2 Torr, below 1 Torr, below 800 mTorr, below 600 mTorr, or below 500 mTorr according to embodiments. The pressure may be maintained between 70 mTorr and 20 Torr, between 100 mTorr and 10 Torr, between 200 mTorr and 5 Torr, or between 500 mTorr and 2 Torr in embodiments. Inert additives or diluents (e.g. nitrogen ($N_2$) or argon (Ar)) may be combined with a chlorine-containing precursor according to embodiments. Thus a partial-pressure of the chlorine-containing precursor in the substrate processing region may be below 50 Torr, below 40 Torr, below 20 Torr, below 10 Torr, below 5 Torr, below 2 Torr, below 1 Torr, below 800 mTorr, below 600 mTorr, or below 500 mTorr according to embodiments. The partial-pressure of the chlorine-containing precursor may be maintained between 70 mTorr and 20 Torr, between 100 mTorr and 10 Torr, between 200 mTorr and 5 Torr, or between 500 mTorr and 2 Torr in embodiments.

Figure 4A:
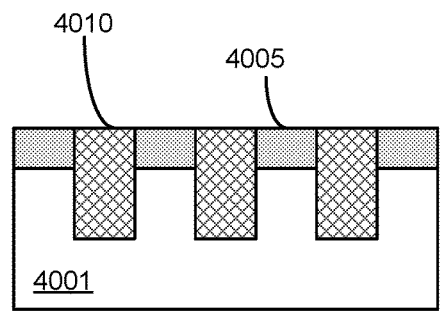
FIGS. 4A, 4B and 4C illustrate cross-sectional views of substrate materials on which selected operations are being performed according to embodiments of the present technology.
Figure 4B:
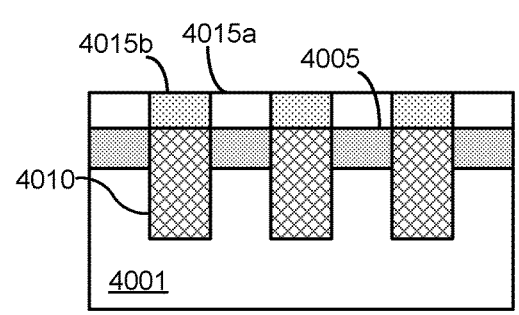
Figure 4C:
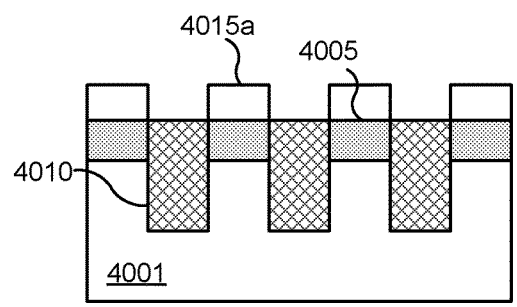

Reference will now be made to FIGS. 4A, 4B, and 4C, which are cross-sectional views of substrate materials on which selected operations are being performed according to embodiments of the present technology. The patterned semiconductor substrate may be a front-end-of-line portion of a device. The patterned semiconductor substrates may include semiconductor substrate 4001, silicon germanium 4005, dielectric gapfill 4010, epitaxial silicon 4015a, and amorphous silicon 4015b. Silicon germanium 4005 may be epitaxially grown on semiconductor substrate 4001 in embodiments. Semiconductor substrate 4001 may be single crystal silicon. Silicon layer 4015 is grown on exposed portions of silicon germanium 4005 and dielectric gapfill 4010 during the same film formation process. However, the differences in the underlying material change the phase of silicon formed. Epitaxial silicon 4015a grows on silicon germanium 4005 while amorphous silicon 4015b grows on gapfill dielectric 4010 according to embodiments. The phase difference between epitaxial silicon 4015a and amorphous silicon 4015b enables the etch processes described herein to remove the amorphous silicon 4015b faster than the epitaxial silicon 4015a and achieve the patterned semiconductor substrate shown in FIG. 4C. The removal may be performed according to the present technology, which may allow etching of the exposed amorphous silicon without or with limited effect on exposed crystalline silicon in embodiments. "Top" and "Up" will be used herein to describe portions/directions perpendicularly distal from the substrate plane and further away from the center of mass of the substrate in the perpendicular direction. "Vertical" will be used to describe items aligned in the "Up" direction towards the "Top". Other similar terms may be used whose meanings will now be clear.

According to embodiments, amorphous silicon may be etched at a selectivity greater than 10:1 with respect to epitaxial silicon, and may be etched at a selectivity greater than 20:1, greater than 30:1, greater than 40:1, greater than 50:1, greater than 60:1, greater than 70:1, greater than 80:1, greater than 90:1, greater than 100:1. In embodiments, there was substantially no, essentially no, or no loss for other exposed epitaxial silicon, providing complete selectivity between amorphous silicon relative to epitaxial silicon. According to embodiments, amorphous silicon may be etched at a selectivity greater than 10:1 with respect to single crystal silicon, and may be etched at a selectivity greater than 20:1, greater than 30:1, greater than 40:1, greater than 50:1, greater than 60:1, greater than 70:1, greater than 80:1, greater than 90:1, greater than 100:1. In embodiments, there was substantially no, essentially no, or no loss for other exposed single crystal silicon. According to embodiments, amorphous silicon may be etched at a selectivity greater than 10:1 with respect to polysilicon, and may be etched at a selectivity greater than 20:1, greater than 30:1, greater than 40:1, greater than 50:1, greater than 60:1, greater than 70:1, greater than 80:1, greater than 90:1, greater than 100:1. In embodiments, there was substantially no, essentially no, or no loss for other exposed polysilicon.

The amorphous silicon removed with the processes described herein may be doped or undoped in embodiments. The amorphous silicon may be intrinsically doped or extrinsically doped according to embodiments. Amorphous silicon may be p-doped or n-doped in embodiments and may be doped with boron and/or phosphorous in embodiments. The crystalline silicon retained (or removed at a slower rate than the amorphous silicon) may be doped, undoped, intrinsically doped or extrinsically doped according to embodiments. Crystalline silicon may be n-doped or p-doped in embodiments and may be doped with phosphorus and/or boron in embodiments.

All film properties and process parameters given for each example provided herein apply to all other examples as well. The chlorine-containing precursor may be flowed into the substrate processing region at a flow rate between 10 sccm and 4000 sccm, between 200 sccm and 3000 sccm, or between 500 sccm and 2000 sccm in embodiments. The wavelengths of suitable UV light for all methods described herein may be between 100 nm and 450 nm, be between 200 nm and 425 nm, or between 300 nm and 410 nm or between 315 nm and 400 nm in embodiments. The UV light may be monochromatic, polychromatic or may essentially be provided at a continuum of frequencies. The UV light may be generated within or outside the substrate processing region and passed through into the substrate processing region by way of a suitably transmissive vacuum viewport. The UV light may be generated by an arc lamp, a deuterium arc lamp, a mercury arc lamp or an excimer laser according to embodiments. The semiconductor substrate may be exposed to UV radiation at a UV power of 1,000 milliWatts/cm$^2$ to 1,500 milliWatts/cm$^2$, for example, between 500 milliWatts/cm$^2$ and 1,350 milliWatts/cm$^2$ in embodiments.

Alternatively, the substrate processing region may be described herein as "plasma-free" during the etch processes described herein. Any or all of the deposition methods described herein may have a low electron temperature in the substrate processing region during the deposition to ensure the beneficial chemical reactions deep within the porous film according to embodiments. The electron temperature may be measured using a Langmuir probe in the substrate processing region. In embodiments, the electron temperature may be less than 0.5 eV, less than 0.45 eV, less than 0.4 eV, or less than 0.35 eV. "Plasma-free" does not necessarily mean the region is devoid of plasma. Ionized species and free electrons created within the plasma region may travel through pores (apertures) in the partition (showerhead) at exceedingly small concentrations. The borders of the plasma in the chamber plasma region are hard to define and may encroach upon the substrate processing region through the apertures in the showerhead. Furthermore, a low intensity plasma may be created in the substrate processing region without eliminating desirable features of the etch processes described herein. All causes for a plasma having much lower intensity ion density than the chamber plasma region during the creation of the excited plasma effluents do not deviate from the scope of "plasma-free" as used herein.

The term "gap" is used throughout with no implication that the etched geometry has a large horizontal aspect ratio. Viewed from above the surface, gaps may appear circular, oval, polygonal, rectangular, or a variety of other shapes. A "trench" is a long gap. A trench may be in the shape of a moat around an island of material whose aspect ratio is the length or circumference of the moat divided by the width of the moat. The term "via" is used to refer to a low aspect ratio trench (as viewed from above) which may or may not be filled with metal to form a vertical electrical connection.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of etching a semiconductor substrate, the method comprising:
    flowing a chlorine-containing precursor into a substrate processing region housing the semiconductor substrate, wherein the semiconductor substrate comprises an exposed amorphous silicon portion and an exposed crystalline silicon portion;
    shining ultraviolet light onto the semiconductor substrate, wherein shining ultraviolet light onto the semiconductor substrate occurs concurrently with the flowing of the chlorine-containing precursor into the substrate processing region; and
    removing an amount of the exposed amorphous silicon portion at a first etch rate.

2. The method of etching a semiconductor substrate of claim 1, further comprising removing an amount of the exposed crystalline silicon portion at a second etch rate, wherein the first etch rate is greater than the second etch rate.

3. The method of etching a semiconductor substrate of claim 1, further comprising removing an amount of the exposed crystalline silicon portion at a second etch rate, wherein the first etch rate is greater than the second etch rate by a factor of ten or more.

4. The method of etching a semiconductor substrate of claim 1, wherein the exposed crystalline silicon portion comprises single-crystal silicon or polysilicon.

5. The method of etching a semiconductor substrate of claim 1, wherein the chlorine-containing precursor comprises $Cl_2$.

6. The method of etching a semiconductor substrate of claim 1, wherein removing the amount of the exposed amorphous silicon portion does not remove any of the exposed crystalline silicon portion.

7. The method of etching a semiconductor substrate of claim 1, wherein the substrate processing region is plasma-free during the removing the amount of the exposed amorphous silicon portion.

8. The method of etching a semiconductor substrate of claim 1, wherein shining the ultraviolet light comprises shining UVA light having wavelengths between 315 nm and 400 nm.

9. The method of etching a semiconductor substrate of claim 1, wherein a partial pressure of the chlorine-containing precursor in the substrate processing region is between 50 mTorr and 50 Torr while removing the amount of the exposed amorphous silicon portion.

10. A method of etching a semiconductor substrate, the method comprising:
    flowing a chlorine-containing precursor into a substrate processing region housing the semiconductor substrate, wherein the semiconductor substrate comprises an exposed amorphous silicon portion and an underlying crystalline silicon portion;
    shining ultraviolet light onto the semiconductor substrate, wherein shining ultraviolet light onto the semiconductor substrate occurs concurrently with the flowing of the chlorine-containing precursor into the substrate processing region;
    removing the exposed amorphous silicon portion; and
    exposing the underlying crystalline silicon portion.

11. The method of etching a semiconductor substrate of claim 10, wherein shining the ultraviolet light comprises shining UVA light from outside the substrate processing region into the substrate processing region.

12. The method of etching a semiconductor substrate of claim 10, wherein a temperature of the substrate is greater than 25° C. while removing the exposed amorphous silicon portion.

13. A method of etching a patterned semiconductor substrate, the method comprising:
    removing a native oxide from a patterned semiconductor substrate;
    forming an exposed crystalline silicon portion of the patterned semiconductor substrate by removing the native oxide;
    forming an exposed amorphous silicon portion of the patterned semiconductor substrate by removing the native oxide;
    exposing both the exposed crystalline silicon portion and the exposed amorphous silicon portion to a chlorine-containing precursor;
    exposing a dielectric gapfill portion disposed underneath the exposed amorphous silicon portion by removing the exposed amorphous silicon portion at a first etch rate while shining ultraviolet light onto the patterned semiconductor substrate, wherein exposing the dielectric gapfill portion leaves a silicon germanium portion disposed underneath the exposed crystalline silicon portion unexposed.

14. The method of etching a semiconductor substrate of claim 13, further comprising removing an amount of the exposed crystalline silicon portion at a second etch rate, wherein the first etch rate is greater than the second etch rate by a factor of ten or more.

15. The method of etching a semiconductor substrate of claim 13, wherein the exposed crystalline silicon portion is epitaxial silicon formed on the silicon germanium portion prior to removing the native oxide.

\* \* \* \* \*